United States Patent [19]

Desor et al.

[11] Patent Number: 5,294,985
[45] Date of Patent: Mar. 15, 1994

[54] SIGNAL LIMITING APPARATUS HAVING IMPROVED SPURIOUS SIGNAL PERFORMANCE AND METHODS

[75] Inventors: Hans-Juergen Desor, Deutlingen; Heinrich Koehne, Voerstetten, both of Fed. Rep. of Germany

[73] Assignee: Deutsche ITT Industries GmbH, Freiburg, Fed. Rep. of Germany

[21] Appl. No.: 934,067

[22] Filed: Aug. 21, 1992

[30] Foreign Application Priority Data

Aug. 29, 1991 [EP] European Pat. Off. ........ 91114523.3

[51] Int. Cl.$^5$ .............................................. H04N 5/14
[52] U.S. Cl. ..................................... 348/607; 348/622; 348/690; 348/380
[58] Field of Search ............... 358/160, 170, 167, 166, 358/27, 35, 36, 37, 39, 38; 307/264, 540, 543, 556; 328/167, 169; 455/308, 307, 306; H04N 5/14

[56] References Cited

U.S. PATENT DOCUMENTS

| | | | |
|---|---|---|---|
| 3,529,244 | 9/1970 | Torick et al. | 325/147 |
| 4,064,537 | 12/1977 | Ota et al. | 358/127 |
| 4,779,133 | 10/1988 | Sugimori | 358/167 |
| 4,812,905 | 3/1989 | Rossi | 358/37 |
| 4,962,426 | 10/1990 | Naoi | 358/167 |

FOREIGN PATENT DOCUMENTS 0157460 4/1985 European Pat. Off. .
2157909 10/1985 United Kingdom .

OTHER PUBLICATIONS

"The Theory of Electrical Filters" by J. D. Rhodes, published by John Wiley & Sons (1976), Chapter 8 entitled Digital Filters.

Primary Examiner—James J. Groody
Assistant Examiner—Sherrie Hsia
Attorney, Agent, or Firm—Thomas L. Peterson

[57] ABSTRACT

A limiter circuit responds to an input signal which has a plurality of frequencies within a given band. The input signal is split up into two frequency ranges by means of a low pass filter for one range and a high pass filter for a second range. The output of the low pass filter is directed to a first limiter while the output of the high pass filter is directed to a variable notch filter. The outputs from the first limiter and the notch filter are added together to provide a sum signal. The sum signal is applied to a second limiter which performs limiting strictly according to the amplitude. The outputs of the second limiter signal provide the desired signal and a control signal to determine how often the second limiter is limiting. The control signal varies the attenuation of the notch filter. In this manner frequencies, within a selective range and which will be otherwise effected by the spurious frequencies generated during limiting, are reduced.

19 Claims, 3 Drawing Sheets

SIGNAL LIMITING APPARATUS HAVING IMPROVED SPURIOUS SIGNAL PERFORMANCE AND METHODS

FIELD OF THE INVENTION

The present invention relates to signal limiting circuits and more particularly to a signal limiting circuit which assures that any spurious signals provided are included in frequency ranges which do not cause disturbance to desired signals.

BACKGROUND OF THE INVENTION

Limiter circuits or limiters are extensively employed in the electronic field. A limiter is used if the level of an incoming signal is too high so that it can only be processed incompletely by subsequent processing circuits. An example of limiting action occurs when amplifiers are driven into cutoff and saturation whereby the gain of the amplifier is so great that the input signal causes limiting in both the positive and negative directions.

Limiters are often referred to as clipping circuits. Clipping circuits or limiters are used when it is desirable to select for transmission that part of an arbitrary waveform which lies above or below some particular reference voltage level. Limiters or clipping circuits are also referred to as voltage selectors or amplitude selectors. There are many different types which are employed, most of which utilize diodes.

A particular problem occurs when a limiter circuit is used in a television receiver. As is well known, television receivers have circuitry which is employed to control the beam current circulating in the television picture tube. The beam current delivered by the individual beam forming systems oftentimes are greater than the current which the television picture tube is designed to handle. In the case of a color television set, overloading results in blooming and color fringing in the bright areas. Thus, modern television receivers and monitors usually include a beam current limiting arrangement which controls the contrast characteristics of the video signals coupled to the picture tube in order to limit the beam current drawn by the picture tube. Beam current limiting is also referred to in the prior art as automatic beam limiting. The purpose of such a beam current limiting arrangement is to insure that excessive beam currents which may cause so-called "white spot blooming" and which may also damage the picture tube, are not provided. Typically, a beam current limiting arrangement senses the average current drawn by the picture tube from the high voltage transformer. The high voltage transformer supplies a high operating voltage to the picture tube, and the beam current limiting circuit generates a control signal for reducing the gain of the video signal processing channel to thereby reduce the peak-to-peak amplitude of the video signals coupled to the picture tube when the level of the beam current exceeds a predetermined threshold. The peak-to-peak amplitude of the video signals is related to the contrast of the image. Thus, such techniques for limiting the beam current are well known.

As indicated above, the effect caused by an excessive beam current mode is sometimes referred to as "blooming". Basically, "blooming" on a black and white scene is evidenced by changes in spot size and can result in changes in picture size, brightness and an overall distortion of the displayed scene. While blooming can occur in a black and white receiver, it can also occur in a compatible color receiver which, with automatic color control (ACC), will serve to degenerate the picture even further. See, for example, U.S. Pat. No. 3,578,903 issued on May 18, 1971 entitled "Control Circuits For Preventing Kiniscope Color Saturation During Blooming" by D. H. Willis. This patent explains the results of both blooming in monochrome and color television receivers.

Apart from the typical prior art types of beam current control circuits, limiter circuits are also necessary and employed in television receivers to control the beam current in the picture tube. The beam current in the picture tube is a function of the magnitude of the luminance signal which is provided, for example, in a color television system by the luminance amplifier. These amplifiers may become overloaded and may deliver currents to the picture tube which are larger than the currents which the color picture tube is designed to handle. Thus, the color picture tube, upon receiving such large signals, will overload resulting in "blooming" and color fringing which disrupts the picture, as described above. Tube limit values, which relate to the average beam current and the peak beam current, must not be exceeded for proper picture tube operation. For small image details, a considerably larger beam current than the average beam current can be tolerated by the color television tube for short times. Conventional limiter circuits in television receivers evaluate the average value and the short time value of the beam current by using threshold sensing circuits and therefore regulate the beam current to a lower value by means of employing a long and a short time constant. In this manner the time constants associated with the limiter circuits determines the attack and release time to enable a viewer to view a proper video signal. Apart from that use of limiting circuits, limiting circuits have been widely employed in television receivers to perform amplitude separation, such as being utilized in the sync separation portions of television receivers. Limiters have been used for noise reduction purposes in color television receivers. See U.K. Patent Application 2157909A published on Oct. 30, 1985 entitled "Noise Reduction Circuit for Composite Video Signals" by M. Kanda. This patent describes the use of a high pass filter, a notch filter, an amplitude limiter and an inverter to provide frequency selective noise reduction for a color television signal.

Limiter circuits which are employed in the luminance channel provide disadvantages in that the limiting adversely affects the entire signal reproduction capability of the receiver. The video signal content is not considered when limiting occurs and it is only the amplitude of the video signal that enables the limiting circuit to operate. As one can understand, a video signal contains many frequency components which relate to the picture content and which enables the picture to be provided in sharp or fine detail, depending on these video components. In various video frequency ranges the hard limiting will cause signal distortions which will adversely effect the reproduction of the signal. Such effects are even more noticeable if the video signals are digitized television signals. In such receivers the analog video signal is converted by means of an analog-to-digital converter to produce digital signals which are indicative of the video signal. In this manner, by utilizing limiting in the luminance channel one can cause aliasing effects which serve to transform into spurious signals which are undesired and which appear, and will be demodulated or otherwise presented, in the visible frequency range. Thus, in this manner, the use of hard limiting will produce spurious signals due to the frequency content of the limiter video signal which will produce interfering effects with the actual picture signal.

U.S. Pat. No. 3,529,244 entitled "Method and Apparatus for Frequency Sensitive Amplitude Limiting" issued on Sep. 15, 1980 to E. Torick et al. This patent describes an audio limiting circuit which separates a signal into low and high frequency components to selectively control gain and effecting preemphasis.

U.S. Pat. No. 4,064,537 entitled "Amplitude Limiting Circuit For Frequency Modulated Video Signals" issued on Dec. 20, 1977 to Y. Ota et al. This patent describes a limiter which uses a high pass and low pass filter. A first limiter amplifies and limits the high pass signals. The low pass signals are added to the limited high pass signals where the resultant output signal is then limited by a second limiter. The system is used in a magnetic tape, frequency modulated, video signal recording apparatus.

It is therefore an object of the present invention to provide a limiter circuit arrangement which produces spurious signals in frequency ranges which do not effect the desired signals.

It is a further object to provide a method for limiting signals wherein spurious signals that result from circuit operation and which are derived according to this method do not adversely effect the actual picture content as viewed.

SUMMARY OF INVENTION

A limiter apparatus is disclosed for amplitude limiting of an input information signal having a plurality of frequency components, which comprises means for filtering the input signal, such filtering means having a low pass frequency response for providing at a first output selected low frequency components in the input signal and having a high pass frequency response for providing at a second output selected higher frequency components present in the input signal; a controllable attenuating means coupled to the second output of the filtering means for selectively attenuating the high frequency components thereof according to the value of a control signal applied thereto; a combining means responsive to an output of the attenuating means and to the first output of the filtering means for providing a combined signal at an output thereof; and limiting means responsive to the combined signal from the combining means to limit the magnitude of the combined signal according to a threshold value and for providing the control signal for the attenuating means for controlling the attenuating of the selected higher frequency components according to the extent of limiting, and whereby the limiter apparatus operates to provide reduced spurious frequencies for those higher frequencies contained within the input signal as compared to the lower frequency components thereof.

DETAILED DESCRIPTION OF THE INVENTION

Figure 1:
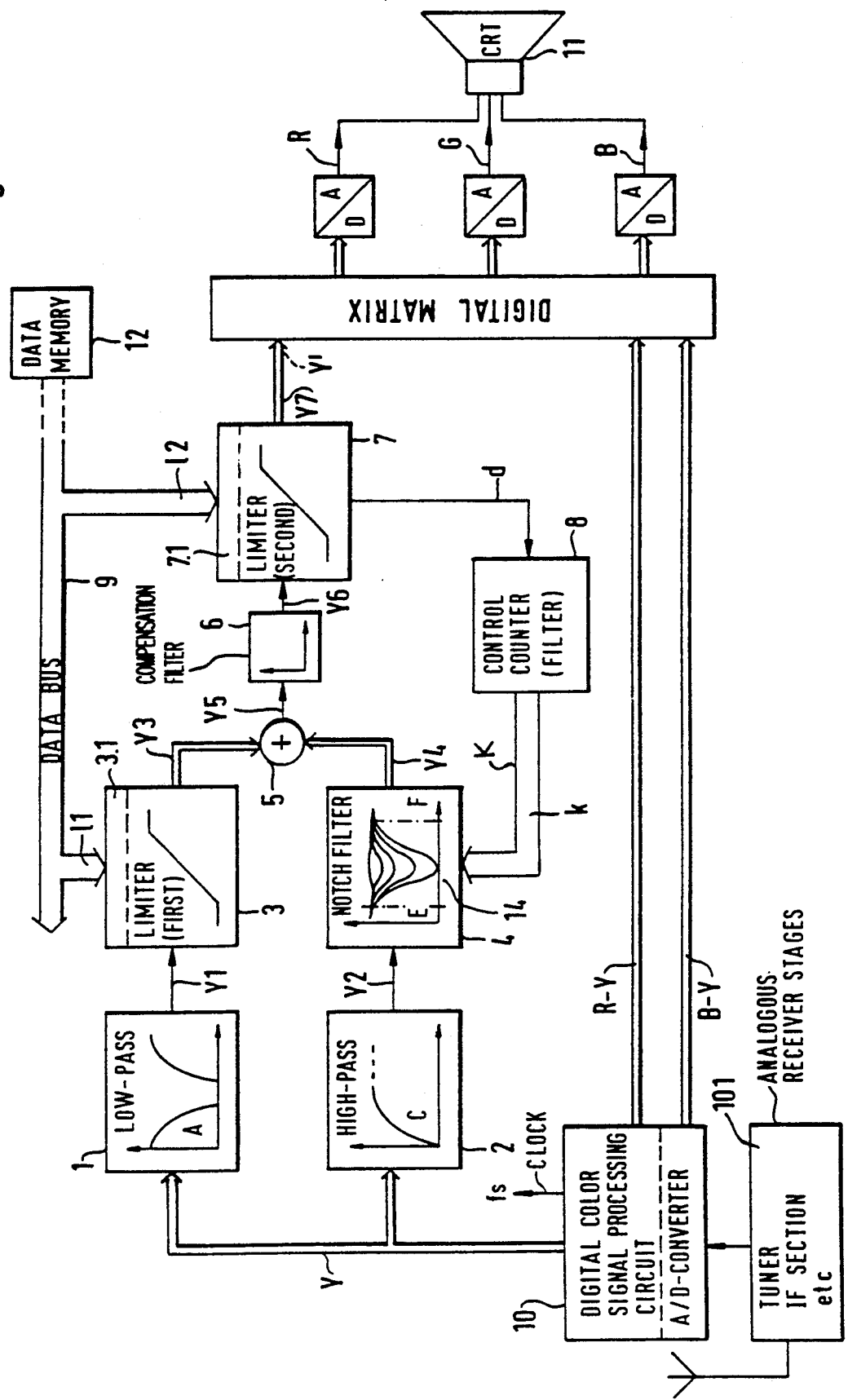
FIG. 1 is a block diagram of a limiter circuit in accordance with this invention and employed in a digital TV receiver.

Referring to FIG. 1, there is shown a block diagram of a limiting circuit which is employed in this invention. FIG. 1 shows the limiting circuit associated with a digital television receiver. The television receiver is a typical color television receiver which can be employed with the present invention. The television receiver could be of any type, including a projection type receiver, employing a picture tube or CRT having separate cathodes or a separate picture tube for red, green and blue, as is well known. Incorporated in the digital television receiver is the tuner section which for purposes of deriving a composite video signal includes luminance, composite synchronization and modulated chrominance component derived from a received RF television signal, which is usually picked up via an antenna. These functions are generally designated by module 101 referenced as TUNER IF section, etc. Normally the digital television receiver includes a tuner, an IF section and a digital color signal processing circuit or module 10. These aspects are well known. The digital television receiver operates to convert the analog composite television signal into a digital signal.

Thus, as shown in FIG. 1, the limiting circuit to be described is supplied via the digital module 10 with the luminance signal (Y signal) at the input. This luminance signal, or Y signal, is present at a clock rate ($f_s$) of, for example, 20 MHz. Thus, at the output of module 10 is the luminance signal which was developed by an analog-to-digital converter operating at a sample rate of 20 MHz. It is, of course, understood that the luminance or Y signal contains the color component values in proper proportions (R, G and B).

All the functions involved in the video signal processing, including sync signal separation and processing, chrominance synchronization, color difference processing, generation of the R, G and B signals, and audio signal processing, are precisely performed with freedom from the adverse effects of voltage drift and component aging. This is due to the digital processing. Hence, digital signal processing is well known. At the output of the digital module 10, the luminance signal Y is now directed to two different paths.

Figure 6:
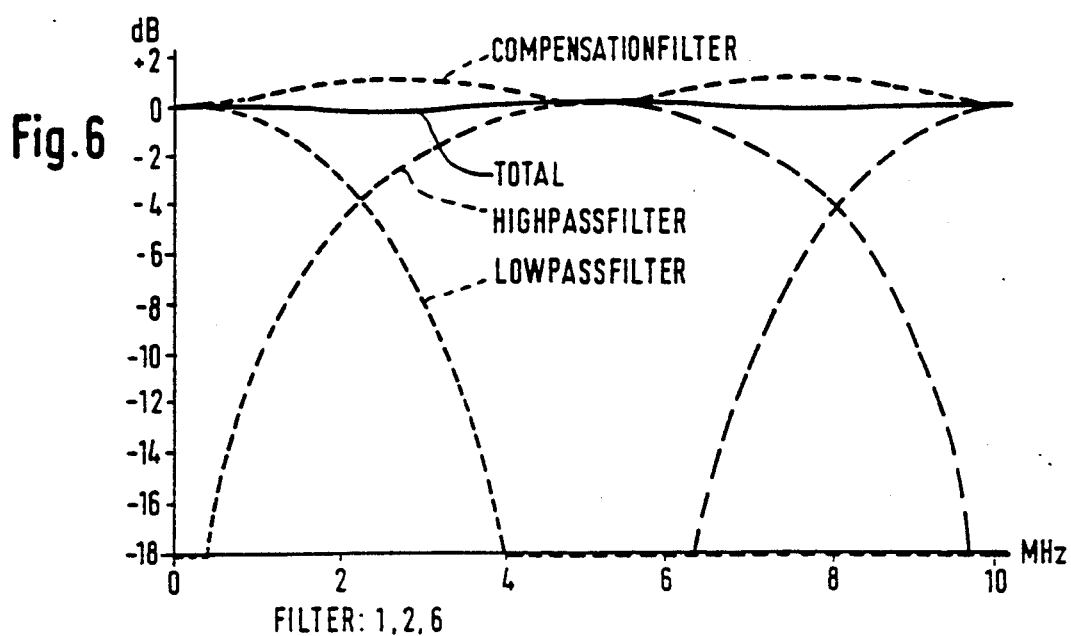
FIG. 6 is a graph of the amplitude versus frequency characteristics of the High pass and low pass filter functions.
Figure 8:
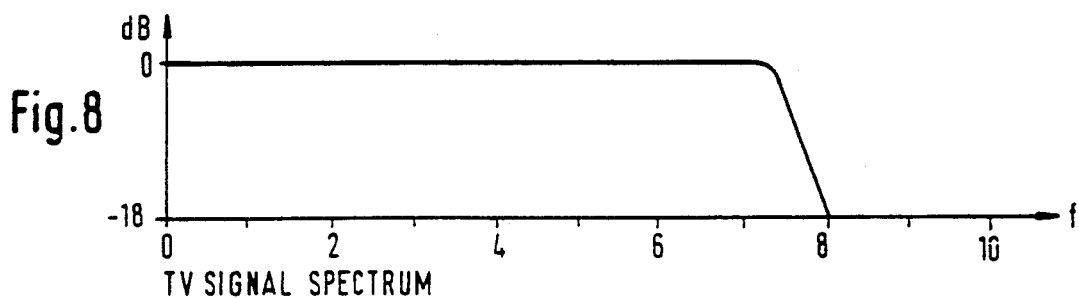
FIG. 8 is a graph depicting the typical spectrum of a modern TV signal.

As seen in FIG. 1, the Y signal with a signal spectrum corresponding to FIG. 8 is applied to the input of a low pass filter 1 and is also applied to the input of a high pass filter 2. The output signal at the output of the low pass filter 1 is designated as $Y_1$ while the output signal at the high pass filter 2 is designated as $Y_2$. Depicted in each of the modules 1 and 2 is the amplitude vs. frequency response of the low pass filter and the high pass filter, which are drawn according to shape and not to scale. See FIG. 6 for greater detail where both the amplitude and frequency response of the low pass and high pass filters are clearly shown. Thus it is seen that the low pass filter 1 passes a first band of low frequencies (A). The high pass filter 2 has a high pass response with a portion C. Both the low pass filter 1 and the high pass filter 2 are digital filters. The output from the low pass filter designated as $Y_1$ is applied to the input signal to a first limiter 3. The limiter 3, as will be explained, is a digital limiter and may have an upper and lower limiting threshold, as seen. However, it is only necessary to practice the present invention to use the upper threshold level in the further processing. The response of the limiter from the upper to lower threshold is linear. Such a limiting function, as indicated in module 3, can be performed by a conventional digital limiter as is known.

Figure 7:
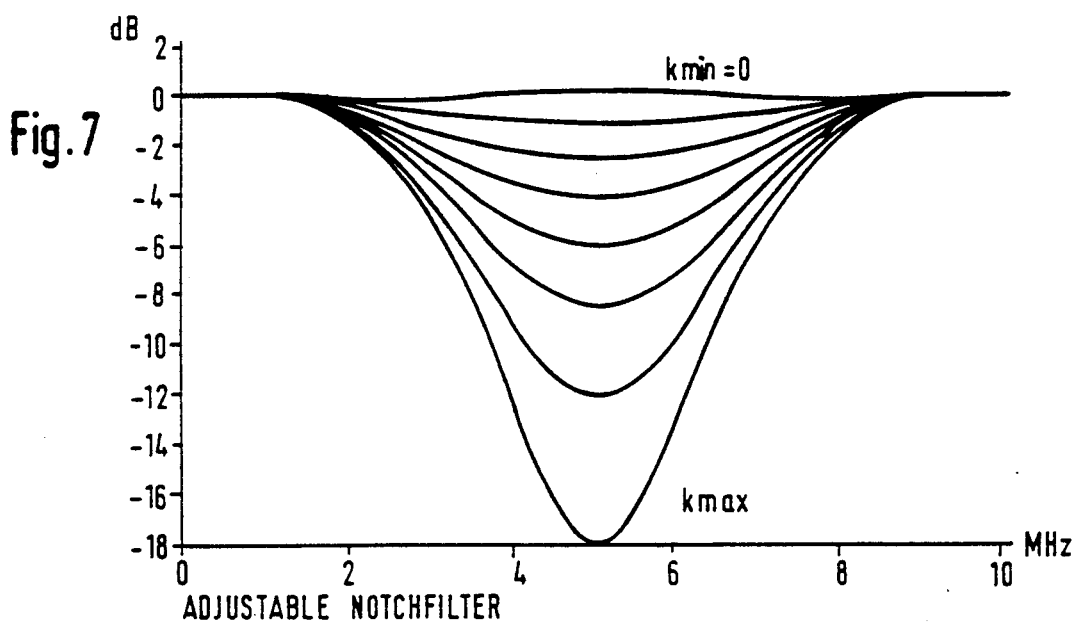
FIG. 7 is a graph of amplitude versus frequency of the notch filter characteristics.

The output from the high pass filter 2 is applied to the input of a notch filter 4. Also shown in module 4 is the amplitude vs. frequency characteristics of the notch filter 4. A more detailed response is shown in FIG. 7. Essentially, a notch filter is an inverse bandpass filter which cancels or lowers the amplitude of all frequencies within a narrow frequency range. As is well known, the degree of loss in the attenuation region increases with the number of sections included in the filter. There are many techniques known to design notch filters, such as the filter 4, which, as will be explained, has variable attenuation characteristics, as indicated in the frequency vs. amplitude diagram. The filter 4 is designated as a notch filter due to the fact that it passes low frequencies within range E relatively unattenuated and high frequencies within range F relatively unattenuated. Frequencies in the "notch" or gap 14 can be blocked or selectively attenuated.

As will be further explained, the attenuation factor of the notch filter is varied by means of a control stage (filter) which can be implemented by a resetable or up/down counter module 8. As will be explained, the control counter 8 produces a control signal k which is applied via the control signal bus k to the control input of the notch filter 4. As is well known, digital bandpass filters employing a notch characteristic can be implemented by various means. They can be controlled to vary attenuation as desired by changing the internal coefficients which can change the quality factor of the filter. One can thereby design filters with the same bandpass characteristics and the same frequency response but with different attenuation or gain factors. The electronic control of filters is well known. Therefore, the attenuation of the notch filter 4 is adjustable by means of the control signal K which is applied to the filter and which control signal is derived from the control counter 8.

As also indicated, the limiter 3 has a first threshold (11) level which corresponds to the permissible average beam current value associated with the CRT or picture tube 11. Thus, the first limiter 3 actually clips the signal $Y_1$ at the first threshold level 11. The notch filter 4 linearly attenuates only those frequency components which lie in the range of the notch frequency gap 14. The notch filter 4 does not clip the signal $Y_2$ so that no harmonics are generated. The notch filter 4 attenuates the signal $Y_2$ obtained at the output of the high pass filter 2 as selectively controlled by the control signal applied to the filter 4 by the control counter 8. The output of the first limiter 3 is designated as $Y_3$ and is applied to one input of an added 5. The output of the notch filter, designated as $Y_4$, is applied to the second input of the adder 5. The adder 5, as is well known, functions to add the output signal $Y_3$ with the output signal $Y_4$ to develop at the output the summation signal $Y_5$. The signal $Y_5$ is applied to one input of a compensation filter 6. Essentially, the compensation filter 6 is only necessary if the frequency response is not ideal due to the splitting of the input signal in the first and second filters 1 and 2. If the splitting is not equal, then the combination of the signals at the outputs, as signal $Y_1$ and $Y_2$ would provide a residual ripple. This residual ripple is compensated for by the inverse frequency response of the compensating filter 6. Thus, the amplitude of the signal Y applied to the low pass filter and the high pass filter should be the same and therefore when $Y_3$ is added to $Y_4$ the result in amplitude should equal the amplitude of the Y signal before further processing. This occurs, for example, with signals in range A of the low pass, corresponding to C of the high pass.

Essentially, since the responses of components as the limiter 3 and notch filter 4 are not ideal, therefore a compensating filter 6 may be necessary. In this manner the output from the added 5 is applied to the input of the compensating filter 6. The output of the filter 6 is $Y_6$ and is applied to the input of a second limiter 7. The second limiter 7 has a threshold level (12) that corresponds to the permissible peak beam current value of the CRT or picture tube 11. The output signal $Y_7$ now satisfies all limiting conditions and corresponds to the modified luminance signal designated as Y'. As one can understand, the second limiter 7 has an output control lead designated by the reference numeral d. This output lead provides the input to the control counter 8. Thus, the threshold of the second limiter circuit is adapted to the permissible peak beam current value associated with the CRT 11. In this manner the threshold 12 set for the second limiter circuit is a function of the peak beam current value of the picture tube or CRT 11. Therefore, the limiter circuit may provide any degree of limiting and provide hard limiting of the signal $Y_6$. As one can see, the signal $Y_6$ is generated by the addition of signals $Y_3$ and $Y_4$ as is $Y_5$ which are respectively derived from the first limiter 3 and the notch filter 4. In any event, the second limiter 7 is in the linear range during most of the operating time, and signal reduction is mainly provided by the limiter 3 and the notch filter 4.

Depending how often limiting occurs within a given time interval in limiter 7, the control signal on output lead d detects the fact and increases the content of the control counter 8. The most significant bits of the control counter 8 are used as the control signal to control the digital control input of the notch filter 4. Thus, the digital control circuit 8 controls the attenuation factors of the notch filter 4. Instead of the feedback control of the notch filter, as shown in FIG. 1, feed forward control of the notch filter 4 may of course be implemented. In that case the control signal must be derived from a preceding stage.

The invention is predicated by recognizing that low video signal frequencies are not critical with respect to clipping. In this manner, when the frequencies of the video are mainly low values, they are passed through the low pass filter 3 and magnitude of clipping is not of concern. Higher video signal frequencies, particularly those in the range of $f_s/4$ at a digitization of $f_s = 20$ MHz therefore the frequencies of about 5 MHz are particularly critical with respect to clipping. Therefore, video signal frequencies which lie in this critical frequency range of 5 MHz are lowered by a linear reduction in amplitude by the notch filter 4. The time constant of the control counter or filter 8 is sufficient to cover at least one video field so that the limiting action is uniform for the whole image impression. The time constant may be implemented by a counter reset signal or by using an up/down counter for control counter 8.

In order to accommodate a wide variety of CRT's, there is shown a data memory 12. In the data memory 12, which may be a ROM, EPROM and so on, there is stored threshold values 11 for the first limiter 3, as well as threshold values 12 for the second limiter 7. The limiters 3, 7 are digital limiters which are well known. The threshold levels 11 and 12 as stored in memory are applied to the threshold inputs 3.1 and 7.1 of the limiters 3 and 7 respectively. Thus, the data bus 9 applies the values of the first and second thresholds, which are the values of the threshold limits for the first limiter and the second limiter from the data memory 12. In this manner the data memory 12 can store threshold values for a wide plurality of CRTs 11 such as those CRTs of different sizes, different manufacturers and so on.

Figure 2:
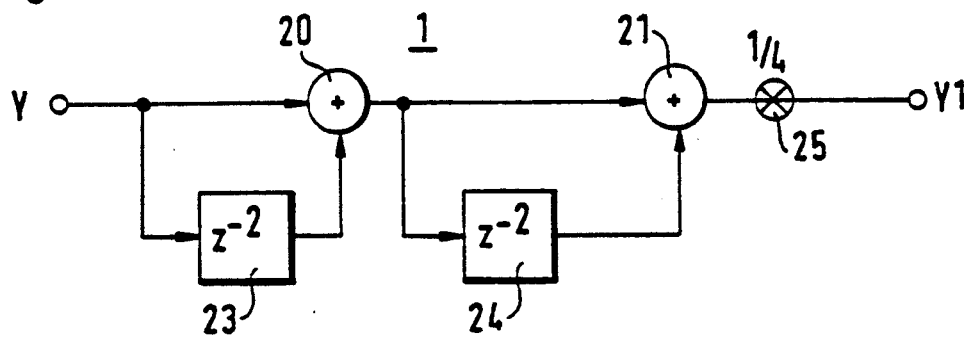
FIG. 2 is a simple block diagram showing a configuration of a low pass filter used in this invention.

Referring to FIG. 2 there is shown the structure for a digital low pass filter which may be filter 1 of FIG. 1 and is operable at a digitization rate of 20 MHz. The low pass filter of FIG. 1 has a transfer function as follows:

$$H(z) = \tfrac{1}{4} \times (1+z^{-2})^2.$$

As one can see from FIG. 2, the low pass filter essentially consists of a first and a second adder 20 and 21 which are respectively coupled to delay modules 23 and 24. The filter is such that the input applied is designated as Y and the output is Y1. Shown in the filter is a multiplier 25 which reduces the filter output signal by a factor of ¼. Essentially, the configuration depicted in FIG. 2 is a digital filter configuration with the above noted transfer function.

As is well understood, the transfer function for a digital filter may be written as H(z) where z equals $e^{-Tp}$ where T is the sampling period of the system. Although the transfer function must be stable and therefore devoid of poles in $|z| \leq 1$ a digital filter is usually non-reciprocal and can readily be active. As is well known, digital filters use multipliers, adders and basic delay elements to provide a given transfer function. Thus one can implement digital filters directly from the block diagram shown, and one will understand how such a filter is implemented. The module which is indicated next to numeral 25 depicts said multiplier with a given factor (¼).

Figure 3:
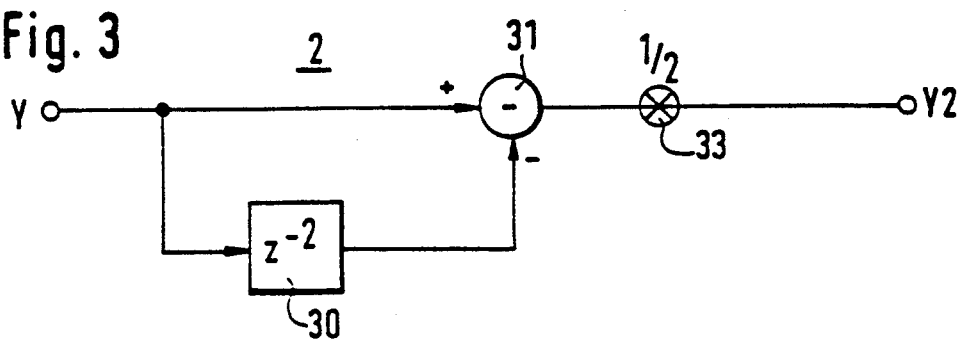
FIG. 3 is a simple block diagram depicting the configuration of a digital high pass filter used in this invention.

Referring to FIG. 3 there is shown a schematic of the high pass filter as for example filter 2 of FIG. 1. The transfer function of the high pass filter is as follows:

$$H(z) = \tfrac{1}{2} \times (1-z^{-2})$$

As one can see, this filter is implemented by means of module 30 which is coupled now to a subtractor module 31 whereby the multiplier 33 reduces the filter output signal by a factor of ½.

Figure 4:
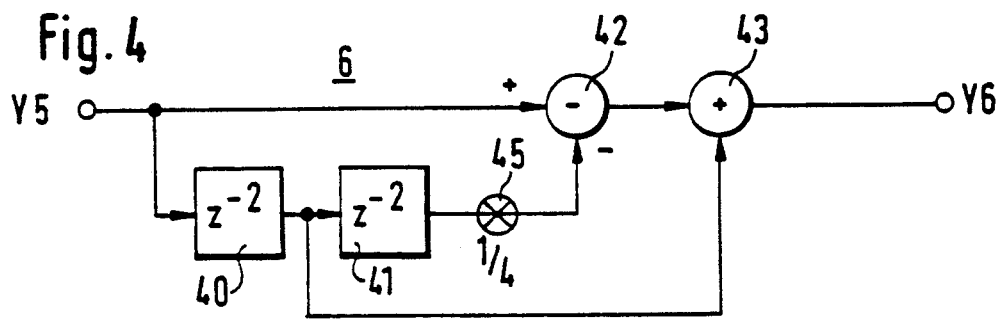
FIG. 4 is a block diagram depicting an example of a compensation filter used in this invention.

Referring to FIG. 4 there is shown a block diagram of the compensation filter 6 depicted in FIG. 1, having a transfer function:

$$H(z) = -0.25 + z^{-2} - 0.25 \times z^{-4}$$

The compensation filter shown in FIG. 4 utilizes a subtractor 42 and an adder 43 with delay modules 40 and 41 and a multiplier designated by reference numeral 45 which reduces the filter output signal by a factor of ¼.

Figure 5:
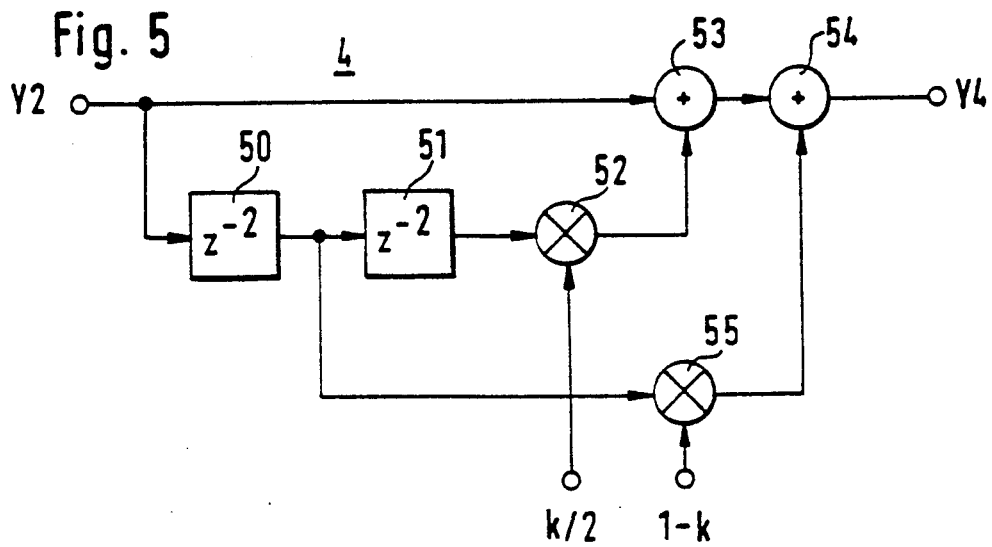
FIG. 5 is a block diagram depicting the notch filter utilized in this invention.

FIG. 5 depicts a schematic diagram of the digital filter employed to implement the notch filter and has the transfer function as follows:

$$H(z) = k/2 + (1-k) \times z^{-1} + k/2 \times z^{-4}$$

where k = 0–0.5

The filter in FIG. 5 shows delay modules 50 and 51 which operate in conjunction with multipliers 52 and 55. There is also shown adders 53 and 54 which provide with the above the transfer function. It is seen that the multipliers 52 and 55 receive, respectively, the coefficients k/2 as well as 1−k where k is a positive integer between 0 and 0.5.

As indicated above, the digital filters are well known. See a text entitled "The Theory of Electrical Filters" by J. D. Rhodes, published by John Wiley & Sons (1976), Chapter 8 entitled "Digital Filters". There are many other digital filters and schemes which can be employed to implement all the filter elements depicted above.

As indicated above, the invention is predicated on recognition that low video signal frequencies are uncritical with respect to clipping. Higher video signal frequencies, particularly in the range of fs/4 at digitization rate of fs=20 MHz, are particularly critical with request to clipping. Therefore, video-signal frequencies which lie within this critical range fs/4 are lowered by a linear reduction in amplitude.

What is claimed is:

1. A limiter apparatus for amplitude limiting an input information signal having a plurality of frequency components, comprising:

means for filtering said input signal, said means having a low pass frequency response for providing at a first output selected low frequency components in said input signal and having a high pass frequency response for providing at a second output selected higher frequency components present in said input signal;

controllable attenuating means coupled to said second output for selectively attenuating said high frequency components according to the value of a control signal applied thereto;

combining means responsive to an output of said attenuating means and said first output of said filtering means for providing at an output a combined signal; and limiting means responsive to said combined signal to limit the magnitude of said combined signal according to a first threshold value and for providing said control signal for said attenuating means for controlling said attenuation of said high frequency components according to the extent of limiting whereby said limiter apparatus operates to provide reduced spurious frequencies for those higher frequencies contained within said input signal as compared to said lower frequency components.

2. The limiter apparatus according to claim 1 further including a limiter having an input coupled to said first output of said filtering means to limit said low frequency components at an output according to a second threshold value with said output of said limiter applied to an input of said combining means.

3. The limiter apparatus according to claim 2 wherein said combining means is an adder for receiving said output of said limiter at a first input and said output of said attenuating means at a second input to provide at said output said combined signal.

4. The limiter apparatus according to claim 3 wherein said attenuating means includes a notch filter for attenuating a selected range of frequencies contained within said input signal and indicative of higher frequency values than those provided at said first output of said filtering means.

5. The limiter apparatus according to claim 4 wherein said input signal is a digital television luminance (Y) signal having a digitization frequency.

6. The limiter apparatus according to claim 5 further including a color television CRT coupled to the output of said limiting means for receiving said digital television luminance signal as processed by said limiter apparatus.

7. The limiter apparatus according to claim 5 further including a compensation filter having an input coupled to the output of said adder for providing at an output a compensated signal with said output of said compensation filter coupled to the input of said limiting means.

8. The limiter apparatus according to claim 1 further including memory means coupled to said limiting means and operative to store therein a plurality of selectable values indicative of different threshold limiting levels.

9. The limiter apparatus according to claim 7 wherein said digitization frequency is 20 MHz.

10. The limiter apparatus according to claim 9 wherein said low pass frequency response of said filtering means has a transfer function H(z) of:

$$H(z) = \tfrac{1}{4} \times (1 + z^{-2})^2$$

said high pass frequency response of said filtering means has a transfer function (Hz) of:

$$H(z) = \tfrac{1}{2} \times (1 - z^{-2})$$

said notch filter has a transfer function H(z) of:

$$H(z) = k/2 + (1-k) \times z^{-1} + k/2 \times z^{-4}$$

where $k = 0$–$0.5$ and said compensation filter has a transfer function H(z) of:

$$H(z) = -0.25 + z^{-2} - 0.25 \times z^{-4}.$$

11. The limiter apparatus according to claim 4 further including control means having an input coupled to said limiting means for providing at an output said control signal for said notch filter to vary said attenuation of said selected range of frequencies according to the extent of limiting of said limiting means.

12. The limiter apparatus according to claim 1 wherein said means for filtering includes a digital low pass filter having an input for receiving said input information signal for providing said low pass frequency response to provide low frequency components at said first output and a digital high pass filter having an input coupled to said input of said low pass filter for providing high frequency components at said second output.

13. The limiter apparatus according to claim 8 wherein said stored values are indicative of various cathode ray tubes employed in television receivers.

14. A method of limiting an information signal, comprising the steps of:
   filtering said signal to provide a first band of low frequencies contained in said information signal at a first output and to provide a second band of high frequencies in said signal at a second output;
   limiting said first band of frequencies;
   controllably attenuating said second band of frequencies;
   combining said limited first band with said attenuated second band to provide a combined signal;
   limiting said combined signal to provide an output combined signal; and
   controlling the amount of attenuation according to the extent of limiting of said combined signal.

15. The method according to claim 14 wherein said first band of frequencies is limited according to a first threshold level and said combined signal is limited according to a second threshold level.

16. The method according to claim 15 wherein said information signal is a digital luminance signal within a television receiver, said output combined signal is applied to a CRT of said television receiver and wherein the dynamic range of said CRT is limited by said first and second threshold levels.

17. The method according to claim 14 wherein said step of controlling the attenuation includes applying a control signal to a controllable notch filter to vary the attenuation of said notch filter according to the magnitude of said control signal.

18. The method according to claim 16 further including the step of storing in memory pairs of first and second threshold values indicative of CRTs having different dynamic ranges.

19. The method according to claim 14 wherein the step of combining includes adding said limited first band of frequencies with said attenuated second band of frequencies to provide a summed signal at an output.

* * * * *